(12) United States Patent
Hahn et al.

(10) Patent No.: US 12,250,842 B2
(45) Date of Patent: Mar. 11, 2025

(54) SEMICONDUCTOR COMPONENT, DEVICE HAVING A SEMICONDUCTOR COMPONENT AND METHOD OF PRODUCING SEMICONDUCTOR COMPONENTS

(71) Applicant: OSRAM Opto Semiconductors GmbH, Regensburg (DE)

(72) Inventors: Berthold Hahn, Hemau-Hohenschambach (DE); Georg Bogner, Hainsacker/Lappersdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 430 days.

(21) Appl. No.: 17/639,160

(22) PCT Filed: Aug. 19, 2020

(86) PCT No.: PCT/EP2020/073200
§ 371 (c)(1),
(2) Date: Feb. 28, 2022

(87) PCT Pub. No.: WO2021/037633
PCT Pub. Date: Mar. 4, 2021

(65) Prior Publication Data
US 2022/0328738 A1    Oct. 13, 2022

(30) Foreign Application Priority Data
Aug. 28, 2019    (DE) ...................... 10 2019 212 944.7

(51) Int. Cl.
*H01L 33/48*    (2010.01)
*H10H 20/01*    (2025.01)
(Continued)

(52) U.S. Cl.
CPC .......... *H10H 20/855* (2025.01); *H10H 20/01* (2025.01); *H10H 20/82* (2025.01);
(Continued)

(58) Field of Classification Search
CPC ......... H01L 33/00; H01L 33/22; H01L 33/38; H01L 33/40; H01L 33/44; H01L 33/46;
(Continued)

(56) References Cited

U.S. PATENT DOCUMENTS

| 5,779,924 A | 7/1998 | Krames et al. |
| 6,066,861 A | 5/2000 | Höhn et al. |

(Continued)

FOREIGN PATENT DOCUMENTS

| DE | 197 09 228 A1 | 9/1997 |
| DE | 10 2015 120 642 A1 | 6/2017 |

(Continued)

OTHER PUBLICATIONS

Kewei Chen et al., "Integration of Phosphor Printing and Encapsulant Dispensing Processes for Wafer Level LED Array Packaging," 2010 11th International Conerence on Electronic Packaging Technology & High Density Packaging, 2010, pp. 1386-1392.

(Continued)

*Primary Examiner* — Chuong A Luu
(74) *Attorney, Agent, or Firm* — DLA Piper LLP (US)

(57) ABSTRACT

A semiconductor component includes a radiation exit surface; a semiconductor body having an active region that generates radiation; wherein a molded body molded onto the semiconductor body; contacts for external electrical contacting of the semiconductor component are accessible on an outer side of the molded body; a deflection structure arranged between the active region and the radiation exit surface; a planarization layer arranged on the deflection structure; and a polarizer arranged on a side of the planarization layer facing away from the semiconductor body; wherein the semiconductor body on a side facing away from the radiation exit surface includes a mirror structure having at least one dielectric layer and a metallic connection layer, (Continued)

and the dielectric layer is arranged at locations between the semiconductor body and the metallic connection layer.

12 Claims, 3 Drawing Sheets

(51) Int. Cl.
    *H10H 20/82*         (2025.01)
    *H10H 20/832*       (2025.01)
    *H10H 20/851*       (2025.01)
    *H10H 20/853*       (2025.01)
    *H10H 20/855*       (2025.01)
    *H10H 20/857*       (2025.01)

(52) U.S. Cl.
    CPC ........ *H10H 20/835* (2025.01); *H10H 20/851* (2025.01); *H10H 20/853* (2025.01); *H10H 20/857* (2025.01); *H10H 20/032* (2025.01); *H10H 20/0363* (2025.01); *H10H 20/0364* (2025.01)

(58) Field of Classification Search
    CPC ......... H01L 33/48; H01L 33/50; H01L 33/54; H01L 33/58; H01L 33/62; H01L 33/405; H01L 33/486; H01L 33/382; H01L 33/0095; H01L 2933/005; H01L 2933/0016; H01L 2933/0033; H01L 2933/0058; H01L 2933/0066; H10H 20/01; H10H 20/82; H10H 20/832; H10H 20/851; H10H 20/853; H10H 20/855; H10H 20/857; H10H 20/841; H10H 20/032; H10H 20/0363; H10H 20/0364; H10H 20/835; H10D 1/00; H10D 1/021; H10D 84/83; H10D 84/8316; H10D 86/01; H10D 86/0227; H10F 39/00; H10F 77/00; H10F 77/939
    USPC ........................................................ 257/98
    See application file for complete search history.

(56) References Cited

U.S. PATENT DOCUMENTS

| | | |
|---|---|---|
| 8,079,743 B2 | 12/2011 | Bailey et al. |
| 8,299,473 B1 | 10/2012 | D'Evelyn et al. |
| 8,331,412 B2 | 12/2012 | Amann et al. |
| 10,018,871 B1 | 7/2018 | Song et al. |
| 2007/0285000 A1 | 12/2007 | Lim et al. |
| 2008/0035944 A1 | 2/2008 | Eberhard et al. |
| 2009/0236693 A1 | 9/2009 | Moustakas et al. |
| 2010/0051983 A1 | 3/2010 | Shum |
| 2010/0072880 A1 | 3/2010 | Adachi et al. |
| 2010/0220459 A1 | 9/2010 | Jagt et al. |
| 2010/0233835 A1 | 9/2010 | Kusonoki |
| 2010/0301026 A1* | 12/2010 | Oishi ................ H01L 21/31127 219/121.67 |
| 2011/0200293 A1 | 8/2011 | Zhang et al. |
| 2011/0254036 A1 | 10/2011 | Kim et al. |
| 2014/0209960 A1 | 7/2014 | Park et al. |
| 2016/0343908 A1 | 11/2016 | Aldaz et al. |
| 2017/0242172 A1 | 8/2017 | Kerzabi et al. |
| 2017/0250318 A1 | 8/2017 | Cha et al. |
| 2017/0294565 A1 | 10/2017 | Kim |
| 2018/0350788 A1 | 12/2018 | Rafael et al. |

FOREIGN PATENT DOCUMENTS

| | | |
|---|---|---|
| EP | 2 403 022 B1 | 1/2012 |
| EP | 2 423 717 A1 | 2/2012 |
| EP | 2 804 225 A1 | 11/2014 |
| EP | 3 352 005 A1 | 7/2018 |
| KR | 20180081378 A | 7/2018 |
| WO | 2009/092362 A1 | 7/2009 |
| WO | 2015/011028 A1 | 1/2015 |

OTHER PUBLICATIONS

Werner Hofmann et al., "Long-Wavelength High-Contrast Grating Vertical-Cavity Surface-Emitting Laser," IEEE Photonics Journal, vol. 2, No. 3, Jun. 2010, 415-422.

* cited by examiner

US 12,250,842 B2

SEMICONDUCTOR COMPONENT, DEVICE HAVING A SEMICONDUCTOR COMPONENT AND METHOD OF PRODUCING SEMICONDUCTOR COMPONENTS

TECHNICAL FIELD

This disclosure relates to a semiconductor component and to a device having such a semiconductor component and also to a method of producing semiconductor components.

BACKGROUND

Display devices often find application for the representation of moving images such as when the imaging unit is backlit by light emitting diodes. This imposes stringent requirements on the light emitting diodes with regard to the efficiency thereof in conjunction with small dimensions. The light demand increases even further for so-called light field display devices (light field displays), which enable a representation that appears three-dimensional.

It could therefore be helpful to simplify efficient backlighting with light sources in a compact design.

SUMMARY

We provide a semiconductor component including a radiation exit surface; a semiconductor body having an active region that generates radiation; wherein a molded body molded onto the semiconductor body; contacts for external electrical contacting of the semiconductor component are accessible on an outer side of the molded body; a deflection structure arranged between the active region and the radiation exit surface; a planarization layer arranged on the deflection structure; and a polarizer arranged on a side of the planarization layer facing away from the semiconductor body; wherein the semiconductor body, on a side facing away from the radiation exit surface includes a mirror structure having at least one dielectric layer and a metallic connection layer, and the dielectric layer is arranged at locations between the semiconductor body and the metallic connection layer.

We also provide a method of producing a plurality of semiconductor components including a) providing a semiconductor body assemblage having a plurality of semiconductor bodies, wherein the semiconductor bodies, on a side facing away from the radiation exit surface, include a mirror structure having at least one dielectric layer and a metallic connection layer, wherein the dielectric layer is arranged at locations between the semiconductor body and the metallic connection layer; b) forming a planarization layer on the semiconductor body assemblage; c) forming a polarizer layer on the planarization layer; and d) singulating the semiconductor body assemblage with the planarization layer and the polarizer layer into the plurality of semiconductor components.

We further provide the semiconductor component including a radiation exit surface; a semiconductor body having an active region that generates radiation; wherein a molded body molded onto the semiconductor body; contacts for external electrical contacting of the semiconductor component are accessible on an outer side of the molded body; a deflection structure arranged between the active region and the radiation exit surface; a planarization layer arranged on the deflection structure; and a polarizer arranged on a side of the planarization layer facing away from the semiconductor body; wherein the semiconductor body, on a side facing away from the radiation exit surface includes a mirror structure having at least one dielectric layer and a metallic connection layer, and the dielectric layer is arranged at locations between the semiconductor body and the metallic connection layer produced by a method including a) providing a semiconductor body assemblage having a plurality of semiconductor bodies, wherein the semiconductor bodies, on a side facing away from the radiation exit surface, include a mirror structure having at least one dielectric layer and a metallic connection layer, wherein the dielectric layer is arranged at locations between the semiconductor body and the metallic connection layer; b) forming a planarization layer on the semiconductor body assemblage; c) forming a polarizer layer on the planarization layer; and d) singulating the semiconductor body assemblage with the planarization layer and the polarizer layer into the plurality of semiconductor components.

LIST OF REFERENCE SIGNS

Figure 1A:
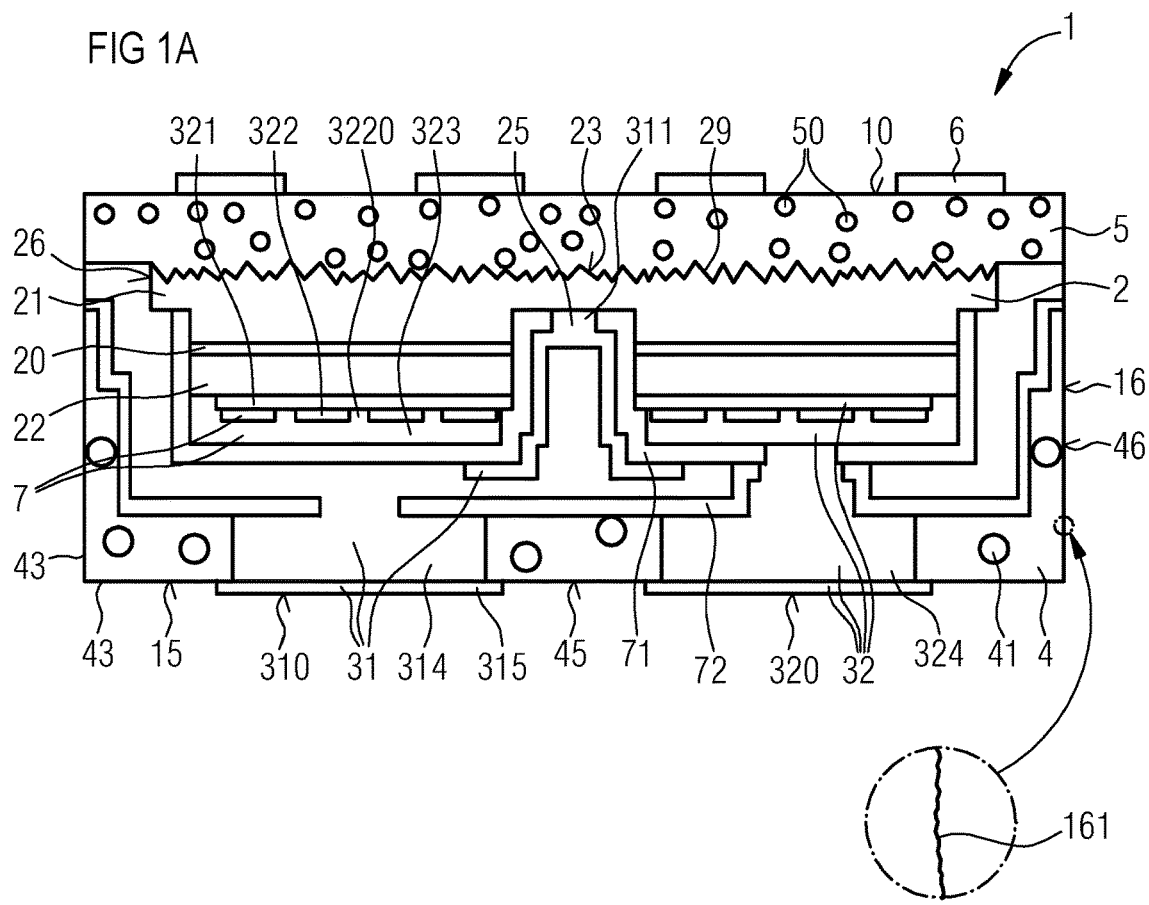
FIGS. 1A and 1B show an example of a semiconductor component in a schematical sectional view (FIG. 1A) and in plan view (FIG. 1B).

1 Semiconductor component
10 Radiation exit surface
15 Rear side
16 Side surface
161 Traces
18 Basic area of the semiconductor component
2 Semiconductor body
20 Active region
200 Semiconductor body assemblage
201 Singulating line
21 First semiconductor layer
22 Second semiconductor layer
23 Radiation passage surface
25 Cutout
26 Side surface
28 Basic area of the semiconductor body
29 Deflection structure
31 First contact
310 First contact pad
311 Connection layer
314 First contact layer
315 First contact pad layer
32 Second contact
320 Second contact pad
321 Current spreading layer
322 Dielectric layer
3220 Opening
323 Metallic connection layer
324 Second contact layer
325 Second contact pad layer
4 Molded body
40 Molded body assemblage
41 Filler
43 Outer side of the molded body
45 Rear side of the molded body
46 Side surface of the molded body
5 Planarization layer 50 Phosphor
6 Polarizer
60 Polarizer layer
7 Mirror structure
70 Basic area of the mirror structure
9 Device
91 Edge layer
92 Mounting carrier
95 Optical waveguide
99 Imaging module

DETAILED DESCRIPTION

Our semiconductor component has a radiation exit surface and a semiconductor body, wherein the semiconductor body comprises an active region provided to generate radiation.

By way of example, the active region is arranged between a first semiconductor layer of a first conduction type and a second semiconductor layer of a second conduction type, which is different from the first conduction type such that the active region is situated in a pn junction. The active region is provided, for example, to generate radiation in the ultraviolet, visible or infrared spectral range. By way of example, the semiconductor body, in particular the active region, contains a III-V compound semiconductor material. By way of example, the semiconductor body consists of an epitaxially deposited semiconductor layer sequence. By way of example, the semiconductor component is free of a growth substrate for the semiconductor layer sequence.

The semiconductor component may comprise a molded body. The molded body may be molded in particular onto the semiconductor body. That means in particular that the molded body, at its side facing the semiconductor body, follows an outer contour of the semiconductor body or a layer arranged on the semiconductor body. The molded body can be spaced apart from the semiconductor body at least at points or else at every point.

In particular, the molded body forms a rear side of the semiconductor component situated opposite the radiation exit surface. By way of example, the molded body is molded onto a portion of the contacts. The molded body contains, for example, a polymer material, for instance an epoxy.

By way of example, the molded body is produced by a molding method. A molding method generally means a method by which a mold compound can be configured in accordance with a predefined shape and cured as necessary. In particular, the term "molding method" encompasses molding, film assisted molding, injection molding, transfer molding and compression molding.

The semiconductor component may comprise contacts for the external electrical contacting. The contacts are accessible in particular on an outer side of the molded body. By way of example, the contacts are accessible on a rear side of the semiconductor component situated opposite a radiation exit surface of the semiconductor component. In particular, a radiation passage surface of the semiconductor body is free of the contacts.

A deflection structure may be arranged between the active region and the radiation exit surface of the semiconductor component. The deflection structure is designed in particular to deflect radiation impinging on the deflection structure. In particular, the deflection structure is embodied in irregular fashion in a lateral direction such that, for example, radiation impinging on the deflection structure at the same angle, but at different lateral points, is deflected into different angles.

A lateral direction means a direction running parallel to the radiation exit surface of the semiconductor component.

By way of example, the deflection structure is embodied at a radiation passage surface of the semiconductor body. The radiation passage surface delimits the semiconductor body on the side facing the radiation exit surface of the semiconductor component.

A planarization layer may be arranged on the deflection structure. The planarization layer is designed in particular to provide a flat, planar surface on the side facing the radiation exit surface of the semiconductor component. In particular, the planarization layer has a greater roughness on the side facing the semiconductor body than at the side facing away from the semiconductor body. By way of example, the planarization layer forms the radiation exit surface of the semiconductor component. However, the radiation exit surface can be provided with a coating, for example, a passivation layer.

The semiconductor component may comprise a polarizer. The polarizer may be arranged in particular on a side of the planarization layer facing away from the semiconductor body. In particular, the polarizer directly adjoins the planarization layer. By way of example, the polarizer may be a grating polarizer. For example, the polarizer is formed by a metallic coating of the planarization layer.

The semiconductor component may comprise a radiation exit surface and a semiconductor body having an active region provided to generate radiation, wherein the semiconductor component comprises a molded body molded onto the semiconductor body. Contacts for the external electrical contacting of the semiconductor component are accessible on an outer side of the molded body. A deflection structure is arranged between the active region and the radiation exit surface. A planarization layer is arranged on the deflection structure. The semiconductor component may thus comprise a polarizer arranged on a side of the planarization layer facing away from the semiconductor body.

The semiconductor component itself thus yields an emission of polarized radiation, in particular linearly polarized radiation. Polarization losses in a downstream imaging unit of a display device, for example, in the form of a liquid crystal display, can thus be avoided.

The planarization layer may have a roughness of at most 50 nm or at most 20 nm on a side facing away from the semiconductor body. In this example, the term roughness refers to the root mean squared roughness, also referred to as rms roughness. We found that a polarizer applied directly to such a planar planarization layer has a particularly high reflectivity, for example, a reflectivity of at least 90% or at least 95%, for radiation portions not transmitted by the polarizer. Absorption losses resulting from the polarizer can thus be reduced. Radiation portions having the polarization that is not to be transmitted by the polarizer can thus be reflected back in the direction of the deflection structure and subsequently impinge once again on the polarizer.

Preferably, the planarization layer contains a material planarizable by a mechanical method, for instance by grinding. By way of example, the planarization layer contains a polysiloxane. In contrast thereto, materials typically used as matrix material for phosphors, for instance silicones, cannot be mechanically planarized in a straightforward way.

The planarization layer is, for example, the sole layer between the semiconductor body and the polarizer. An efficient optical linking of the polarizer to the semiconductor body is thus simplified.

A basic area of the semiconductor component in a plan view of the semiconductor component may be larger than a basic area of the semiconductor body by at most 30% or at most 20% or at most 10%. A large portion of the basic area of the semiconductor component may thus generate radiation in the semiconductor body, in particular in the active region. In contrast thereto, the area of the semiconductor body is very much smaller than the basic area of the semiconductor component if the semiconductor component comprises a prefabricated package body into which a light-generating semiconductor chip is inserted.

The planarization layer may comprise a phosphor for the complete or at least partial conversion of the radiation generated in the active region into a secondary radiation. The secondary radiation has in particular a greater wavelength than the radiation generated in the active region. The planarization layer can thus fulfil the function of a radiation conversion element. The planarization layer can also comprise two or more different phosphors such that the secondary radiation has radiation portions in different spectral ranges, for example, in the red and green spectral ranges. By way of example, the semiconductor component emits mixed light that appears white overall to the human eye.

By way of example, the planarization layer is formed by a matrix material into which the phosphor is embedded.

The radiation conversion element can directly adjoin the polarizer and/or the deflection structure.

The semiconductor body may comprise a mirror structure on a side facing away from the radiation exit surface. The mirror structure is provided to reflect the radiation back in the direction of the radiation exit surface of the semiconductor component. The mirror structure comprises, for example, at least one dielectric layer and a metallic connection layer, wherein the dielectric layer is arranged at points between the semiconductor body and the metallic connection layer. A refractive index of the dielectric layer is in particular lower than a refractive index of a material adjoining the side of the dielectric layer facing the semiconductor body. As a result, total internal reflection can occur at the dielectric layer. Radiation impinging on the dielectric layer at an angle less than a critical angle of total internal reflection at this surface can be reflected back by the metallic connection layer. This results overall in an omnidirectional mirror having a high reflectivity. The higher the reflectivity of the mirror structure, the higher the chance that radiation not transmitted upon a first impingement on the polarizer will not be lost, but rather will emerge from the semiconductor component upon impinging once again on the polarizer.

The dielectric layer may have a plurality of openings via which the metallic connection layer is electrically conductively connected to the semiconductor body. The metallic connection layer thus extends into the openings.

The metallic connection layer can be electrically conductively connected to the semiconductor body directly or to the semiconductor body via an intermediate layer, for instance a current spreading layer.

A basic area of the mirror structure may be at least 80% or at least 90% of a basic area of the semiconductor component. In other words, a large portion of the basic area of the semiconductor component and thus also a large portion of the polarizer is backed by the mirror structure. An effective recovery of radiation portions having the polarization not to be transmitted is thus simplified.

The package body and the planarization layer may have traces of a singulating method on a side surface delimiting the semiconductor component in a lateral direction. By way of example, the traces are traces of material removal by a mechanical method, a chemical method, or a separating method by coherent radiation. Such traces are characteristic of a semiconductor component in which the molded body forming the package is fabricated in an assemblage with a plurality of semiconductor bodies and obtains its shape, in particular its side surfaces, only upon singulation.

The semiconductor component may have a thickness of at most 150 µm or at most 100 µm. The semiconductor component is thus distinguished by a particularly small structural height.

Unless indicated otherwise, thickness indications relate to the extent of the respective element perpendicular to the radiation exit surface.

By way of example, the thickness of the planarization layer is at least 20% or at least 30% of the thickness of the semiconductor component. Alternatively or additionally, the thickness of the planarization layer is at least 120%, at least 200% or at least 500% of the thickness of the semiconductor body.

We also provide a device having a semiconductor component, wherein the semiconductor component can have one or more of the features mentioned above.

The device may comprise an optical waveguide, into which the radiation generated during operation is coupled. By way of example, the radiation is coupled in via a side surface of the optical waveguide. The device can also comprise a plurality of such semiconductor components, wherein, for example, a plurality of semiconductor components are arranged next to one another in linear fashion along a side surface of the optical waveguide.

For example, a distance between the radiation exit surface of the semiconductor component and the optical waveguide is at most 3 mm or at most 2 mm or at most 1 mm.

A side surface of the planarization layer may be covered by an edge layer. By the edge layer, it is possible to prevent unpolarized radiation from emerging at the side surface of the planarization layer. By way of example, the edge layer is formed by a potting into which the semiconductor component is embedded.

The device may be a display device, in particular a light field display device.

Our components are based in particular on the concept that polarized light can be generated particularly efficiently if the semiconductor component itself comprises a polarizer. In particular, the following effects can be achieved.

Generation of polarized light is particularly efficient if the absorption losses within the semiconductor component are so low that efficient light recycling can be effected.

In light recycling or photon recycling, radiation not coupled out directly is absorbed and emitted once again. As a result, there is a further possibility that the radiation having the polarization to be transmitted will emerge onto the polarizer. The undesired radiation portions thus decrease overall in favor of the desired radiation portions. This significantly increases efficiency compared to an arrangement in which a polarizer is disposed downstream of a semiconductor component as a separate element.

Efficient light recycling is provided by the deflection structure, in particular in conjunction with the highly reflective mirror structure.

Furthermore, by the planarization layer, which can also fulfill the function of a radiation conversion element, a planar surface is provided on which a polarizer having a high reflectivity for the undesired polarity is attainable. Efficient light recycling is thereby promoted further. On a non-planar surface, by contrast, even an inherently suitable material would attain only a comparatively low reflectivity and lead to great absorption at the polarizer.

A polarization efficiency of less than 50% is attained in an arrangement of conventional semiconductor components with downstream polarizers. A significantly higher efficiency, for example, 60% or more or 70% or more, can also be achieved with the light recycling described.

Losses occurring at the polarizer take place comparatively near the semiconductor body. The latter is typically thermally well linked and is in contact with a heat sink, for example. Compared to a polarizer as a separate element, heat dissipation is simplified as a result.

Furthermore, with the construction described, semiconductor components can be attained in which the radiation exit surface of the semiconductor component is only slightly larger than the basic area of the light-generating semiconductor body. A high packing density and a high efficiency are attainable as a result.

Furthermore, we provide a method of producing semiconductor components. The method is suitable particularly for the production of a semiconductor component described above. Features described in association with the semiconductor component can therefore also be used for the method, and vice versa.

The method of producing a plurality of semiconductor components may comprise the following steps, in particular in the order indicated.

A semiconductor assemblage having a plurality of semiconductor bodies is provided. A planarization layer is formed on the semiconductor body assemblage. A polarizer layer is formed on the planarization layer. The semiconductor body assemblage with the planarization layer and the polarizer layer is singulated into the plurality of semiconductor components.

Production of the semiconductor components, in particular also the process of forming the polarizers, thus takes place in the component assemblage. As a result, even small semiconductor components can be produced particularly efficiently and cost-effectively.

In particular, the molded bodies of the semiconductor components also arise only upon singulation. By way of example, the planarization layer and a molded body assemblage are severed during singulation. The molded body assemblage is formed on the semiconductor body assemblage by a molding method, for example. This takes place in particular after contacts for the contacting of the semiconductor bodies of the semiconductor body assemblage have already been produced at least in part. The molded body assemblage thus molds around the contacts and fills in particular interspaces between the contacts.

The planarization layer may be planarized before the process of forming the polarizer layer. By way of example, a mechanical method, for instance grinding, lapping or polishing, is suitable for this purpose.

Further configurations and expediences will become apparent from the following description of the examples in association with the figures.

Elements that are identical, of identical type or act identically are provided with the same reference signs in the figures.

The figures are each schematic illustrations and therefore not necessarily true to scale. Rather, comparatively small elements and in particular layer thicknesses may be illustrated with an exaggerated size for elucidation purposes.

Figure 1B:
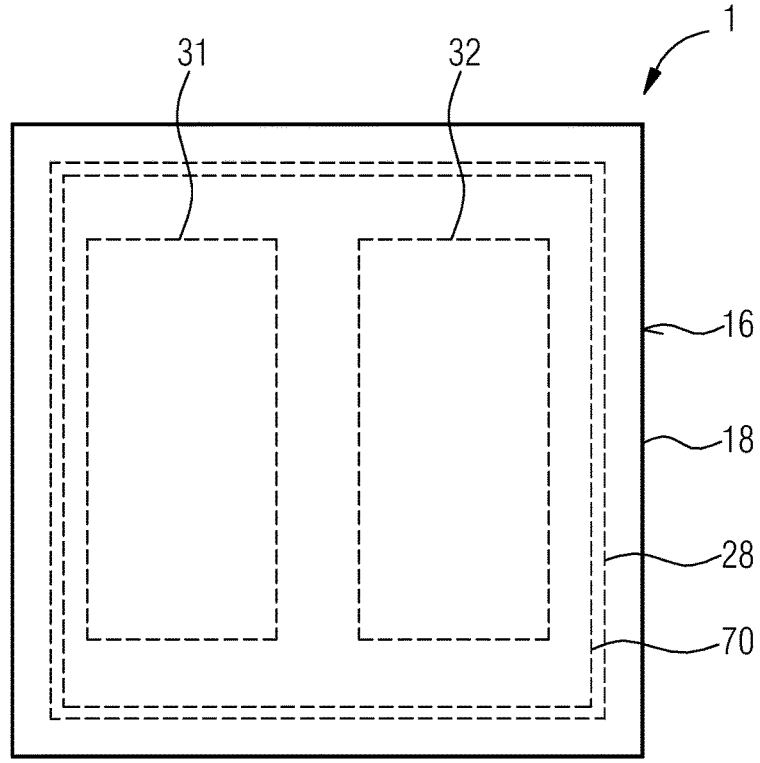

The semiconductor component 1 illustrated in FIGS. 1A and 1B comprises a radiation exit surface 10 and a rear side 15 situated opposite the radiation exit surface. The semiconductor component 1 comprises a semiconductor body 2 having an active region 20 provided to generate radiation, wherein the active region 20 is arranged between a first semiconductor layer 21 and a second semiconductor layer 22. By way of example, the first semiconductor layer is n-conducting and the second semiconductor layer is p-conducting, or vice versa.

Furthermore, the semiconductor component 1 comprises a deflection structure 29. The deflection structure 29 is embodied at a radiation passage surface 23 of the semiconductor body 2. The deflection structure 29 is formed, for example, in the form of an irregular roughening of the radiation passage surface 23. The deflection structure 29 can be formed by a chemical method or a mechanical method, for example.

The semiconductor component 1 furthermore comprises a molded body 4 molded onto the semiconductor body 2. In particular, a plurality of electrically conductive and electrically insulating layers for the electrical contacting of the semiconductor component 1 are situated between the semiconductor body 2 and the molded body 4. An outer side 43 of the molded body 4 is formed by a rear side 45 of the molded body 4 and a side surface 46 of the molded body.

The side surface 46 of the molded body 4 forms at points a side surface 16 delimiting the semiconductor component 1 in a lateral direction.

The rear side 45 of the molded body forms the rear side 15 of the semiconductor component.

A first contact 31 for the electrical contacting of the first semiconductor layer 21 and a second contact 32 for the electrical contacting of the second semiconductor layer 22 are accessible on the outer side 43, in this example on the rear side 45 of the molded body 4. In a departure therefrom, the contacts 31, 32 can also be led to one of the side surfaces 16.

The semiconductor component 1 is embodied in particular as a surface mountable component (surface mounted device, smd).

The first contact 31 and the second contact 32 comprise a first contact pad 310 and a second contact pad 320, respectively, that are exposed for the external electrical contacting.

The first contact 31 and the second contact 32 are each embodied in multilayered fashion. The first contact pad 310 of the first contact 31 and the second contact pad 320 of the second contact 32 are formed by a first contact pad layer 315 and a second contact pad layer 325, respectively. These contact pad layers overlap the molded body 4 at points and are arranged at points on the rear side 45 of the molded body 4. In a departure therefrom, separate contact pad layers can also be dispensed with such that the first contact 31 and the second contact 32 terminate flush with the molded body 4 at the rear side 15.

The concrete configuration of the contacts 31, 32, in particular with regard to their layer sequence and arrangement, can be varied within wide limits as long as charge carriers can be injected into the active region from opposite sides via the contacts.

The molded body 4 optionally comprises a filler 41, for instance to set the optical and/or thermal properties of the molded body. By way of example, a black epoxy is suitable for the molded body.

The first semiconductor layer 21 arranged on the side of the active region 20 facing the radiation exit surface 10 is electrically contacted from the rear side 15 of the semiconductor component 1 via the first contact 31. The radiation passage surface 23 of the semiconductor body 2, which is formed by the first semiconductor layer 21, is free of material for the electrical contacting of the first semiconductor layer. A shading of the radiation passage surface 23 by metallic layers for the electrical contacting of the semiconductor body 2 can thus be avoided. In addition, a small structural height of the semiconductor component is attainable in a simplified manner.

The semiconductor body 2 has a cutout 25 extending through the second semiconductor layer 22 and the active region 20 into the first semiconductor layer 21. In the cutout 25, the first semiconductor layer 21 is electrically connected, by way of example by a connection layer 311 of the first contact 31.

Furthermore, the first semiconductor layer 21 is electrically contacted at a side surface 26 of the semiconductor body 2. This electrical contacting extends in the shape of a frame around the semiconductor body 2, for example, along the entire periphery of the semiconductor body 2. The type of electrical contacting of the first semiconductor layer 21 can be varied within wide limits, however. By way of example, the electrical contacting of the first semiconductor layer 21 can be effected only via the side surface of the first semiconductor layer 21 or only by one or more cutouts 25.

The connection layer 311 is connected to the first contact pad layer 315 via a first contact layer 314.

For the electrical contacting of the second semiconductor layer 22, the second contact 32 comprises by way of example a current spreading layer 321, a metallic connection layer 323, a second contact layer 324 and the contact pad layer 325.

The current spreading layer 321 adjoins the second semiconductor layer 22. By way of example, the current spreading layer contains a transparent conductive oxide (TCO), for example, indium tin oxide (ITO) or zinc oxide (ZnO).

A dielectric layer 322 is arranged at points between the second semiconductor layer 22 and the metallic connection layer 323. The dielectric layer 322 has openings 3220. In the openings 3220, the metallic connection layer 323 produces an electrical contact with the second semiconductor layer 22, via the current spreading layer 321 in the example shown.

The dielectric layer 322 together with the metallic connection layer 323 forms a mirror structure 7. The mirror structure 7 is distinguished by a particularly high reflectivity since radiation impinging on the mirror structure 7 at a comparatively large angle with respect to the normal can be reflected by total internal reflection almost without losses. Radiation portions impinging at an angle less than the critical angle of total internal reflection can pass through the dielectric layer 322, but are subsequently reflected at the metallic connection layer 323.

By way of example, the metallic connection layer 323 contains silver or consists of silver. Silver is distinguished by a particularly high reflectivity in the visible spectral range. However, other metals can also find application, in particular depending on the radiation to be generated by the active region 20.

To avoid an electrical short circuit between the first contact 31 and the second semiconductor layer 22, the semiconductor component 1 comprises a first insulation layer 71. The first insulation layer covers in particular otherwise exposed side surfaces of the active region 20 and of the second semiconductor layer 22, in particular in the region of the side surface 26 of the semiconductor body and in the region of the cutout 25.

Furthermore, the semiconductor component 1 comprises a second insulation layer 72 for electrical insulation between the first contact 31 and the second contact 32.

During production of the semiconductor component, the molded body 4 arises only during singulation from an assemblage. The side surfaces 16 of the semiconductor component 1 may therefore have traces of a singulating method, illustrated in FIG. 1A by traces 161 in an enlarged excerpt from the side surface 16. In particular, such traces may be present on the entire side surface 16 of the semiconductor component 1, for example, also on the planarization layer.

A planarization layer 5 is arranged on the deflection structure 29. The planarization layer 5 levels the unevennesses of the deflection structure 29 and has a particularly low roughness, for example, a roughness of at most 50 nm or at most 20 nm, on the side facing away from the semiconductor body 2, that is to say at the radiation exit surface 10 of the semiconductor component 1. The planarization layer contains a material planarizable by a mechanical method after the process of forming the layer, for example, a polysiloxane.

Furthermore, the semiconductor component comprises a polarizer 6, for instance in the form of a grating polarizer is arranged on a side of the planarization layer 5 facing away from the semiconductor body 2. The semiconductor component 1 thus emits linearly polarized radiation.

In particular, the planarization layer 5 can directly adjoin the polarizer 6. By way of example, the polarizer 6 may be a metallic coating of the planarization layer 5.

For example, the polarizer 6 contains silver or consists of silver. As a result, the polarizer 6, in particular in conjunction with the low roughness of the planarization layer 5, can have a high reflectivity for the radiation portions having the polarization that is not to be transmitted.

Separate polarizers disposed downstream of the semiconductor component 1 in the emission direction can be dispensed with. In contrast to a downstream polarizer, the majority of radiation portions having the polarization that is not to be transmitted are not lost, but rather can be converted at least partly into radiation portions to be transmitted by light recycling on account of the configuration of the semiconductor component 1.

The planarization layer 5 comprises a phosphor 50 to convert the radiation generated in the active region 20 into secondary radiation. The planarization layer thus additionally fulfills the function of a radiation conversion element. By way of example, the phosphor is embedded into a matrix material which can be smoothed, in particular by a mechanical method. A polysiloxane, for example, is suitable for this purpose. A planarization layer 5 acting as a radiation conversion element has, for example, a thickness of 20 µm to 100 µm.

By way of example, the planarization layer 5 contains a phosphor that emits in the red spectral range and a phosphor that emits in the green spectral range. Together with radiation in the blue spectral range generated in the active region 20, the semiconductor component 1 thus makes available mixed light that appears white to the human eye.

However, the planarization layer 5 can also be free of phosphors such that the semiconductor component 1 emits only the radiation generated in the active region 20. In this example, the planarization layer can also have a smaller thickness, for example, 20 µm or less.

It is evident from the plan view in FIG. 1B that a basic area 28 of the semiconductor body 2 is only slightly smaller than a basic area 18 of the semiconductor component. As a result, almost the entire basic area of the semiconductor component 1, for example, at least 80% or at least 90%, can be used to generate radiation.

Furthermore, almost the entire radiation exit surface 10 and thus the area of the polarizer 6 is also backed by the mirror structure 7. Overall, particularly low absorption losses can thus be attained within the semiconductor component 1. Efficient light recycling can be attained as a result.

Figure 2:
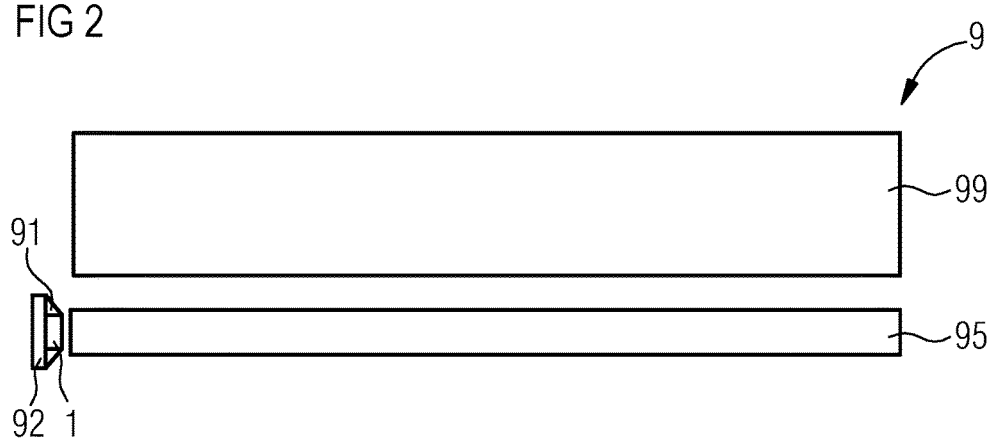
FIG. 2 shows an example of a device.

FIG. 2 shows an example of a device 9 having such a semiconductor component 1.

In particular, the device 9 comprises a plurality of such semiconductor components 1, wherein the semiconductor components 1 are arranged next to one another in linear fashion, for example. The device 9 furthermore comprises an optical waveguide 95. The optical waveguide 95 is expediently polarization-maintaining.

The radiation generated by the semiconductor component 1 is coupled in via a side surface of the optical waveguide 95. With the described configuration of the semiconductor component 1, it is possible to attain an efficient input coupling of radiation even into comparatively thin optical waveguides, for example, having a thickness of 2 mm or 1 mm or 0.8 mm. An optical element for the input coupling of radiation can be arranged (not shown) between the semiconductor component 1 and the optical waveguide 95.

By the optical waveguide 95, an imaging module 99 can be backlit with polarized radiation. On account of the compact design of the semiconductor components 1, the latter can be positioned in densely packed fashion along the side surface of the optical waveguide. It is possible to provide high luminous fluxes for the input coupling at the side surface of the optical waveguide 95, for example, 120 lm/cm or more. The brightness per emission area is, for example, 1000 lm/cm$^2$.

The semiconductor components 1 are arranged on a mounting carrier 92. The semiconductor components 1 can optionally be surrounded by an edge layer 91. By way of example, the edge layer is a potting into which reflective particles, for instance titanium dioxide, are embedded.

The edge layer 91 covers in particular the side surface of the planarization layer 5. The unwanted emission of unpolarized radiation through the side surface of the semiconductor component 1 can be prevented as a result.

In particular, a brightness sufficient for the realization of light field display devices can be achieved with the semiconductor components 1 described.

An example of a method of producing semiconductor components is illustrated schematically in FIGS. 3A to 3D, each of the figures merely showing an excerpt revealing exactly one semiconductor component 1 during production. The method is described by way of example on the basis of a semiconductor component in association with FIG. 1A. To simplify the illustration, not all of the elements are provided with reference signs in FIGS. 3A to 3C.

Figure 3A:
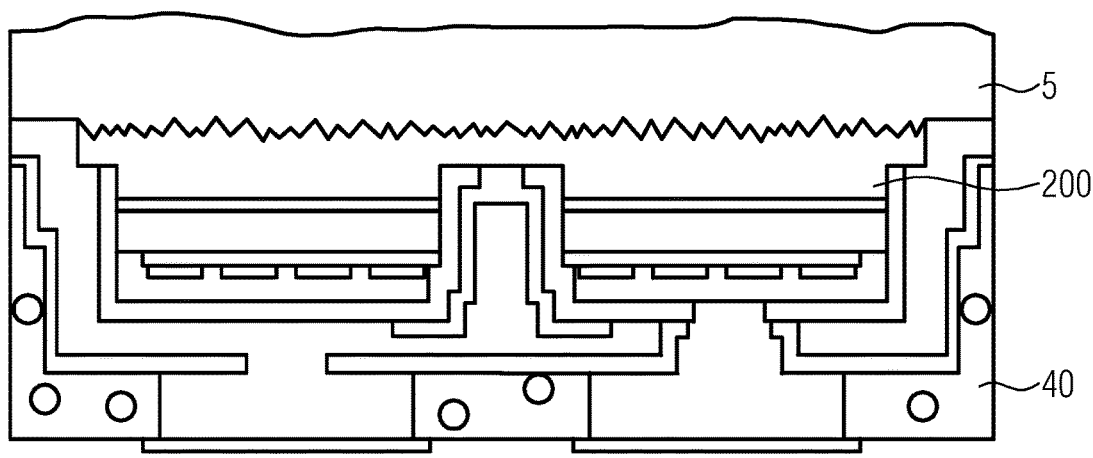
FIGS. 3A to 3D show an example of a method of producing semiconductor components on the basis of intermediate steps illustrated in a schematical sectional view.

The method involves providing a semiconductor body assemblage 200, the later molded bodies of the semiconductor components 1 also being present in a molded body assemblage 40 (FIG. 3A). In the stage shown, a growth substrate for the semiconductor layer sequence of the semiconductor body assemblage 200 has already been removed. A center-to-center distance between adjacent semiconductor bodies of the semiconductor body assemblage 200 preferably corresponds to the original center-to-center distance between the semiconductor bodies on the growth substrate.

The semiconductor body assemblage has, for example, a thickness of 2 μm to 10 μm.

Figure 3B:
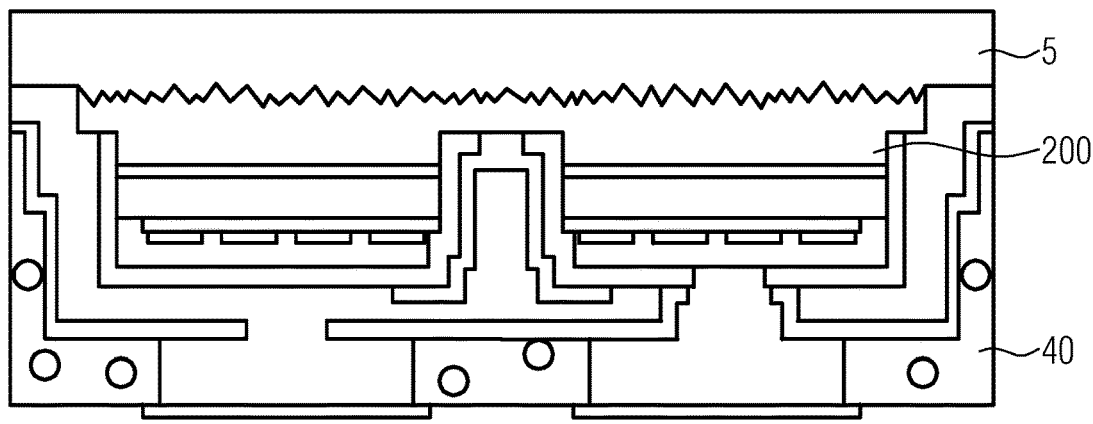

A planarization layer 5 is formed on the semiconductor body assemblage 200. The planarization layer 5 is subsequently smoothed, for example, by a mechanical method (FIG. 3B).

Figure 3C:
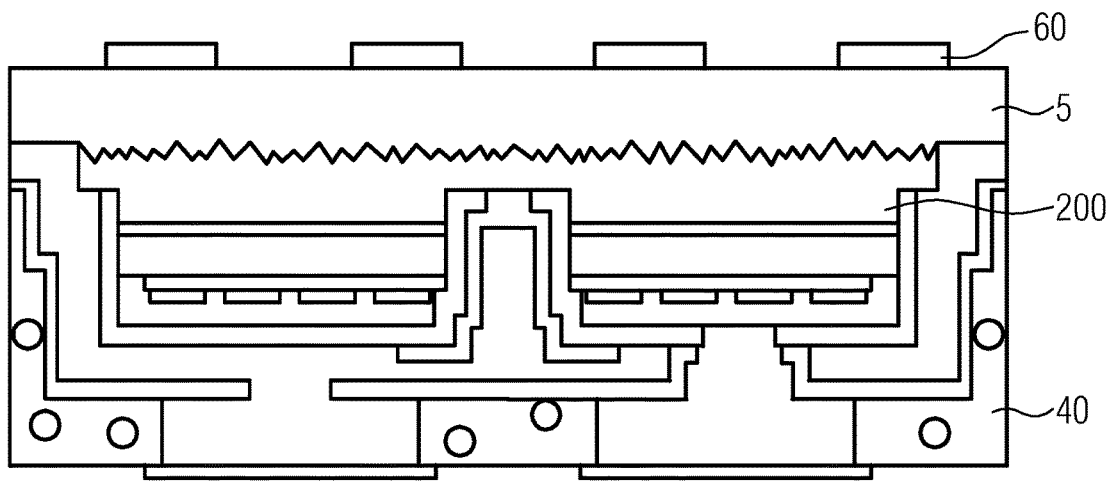
Figure 3D:
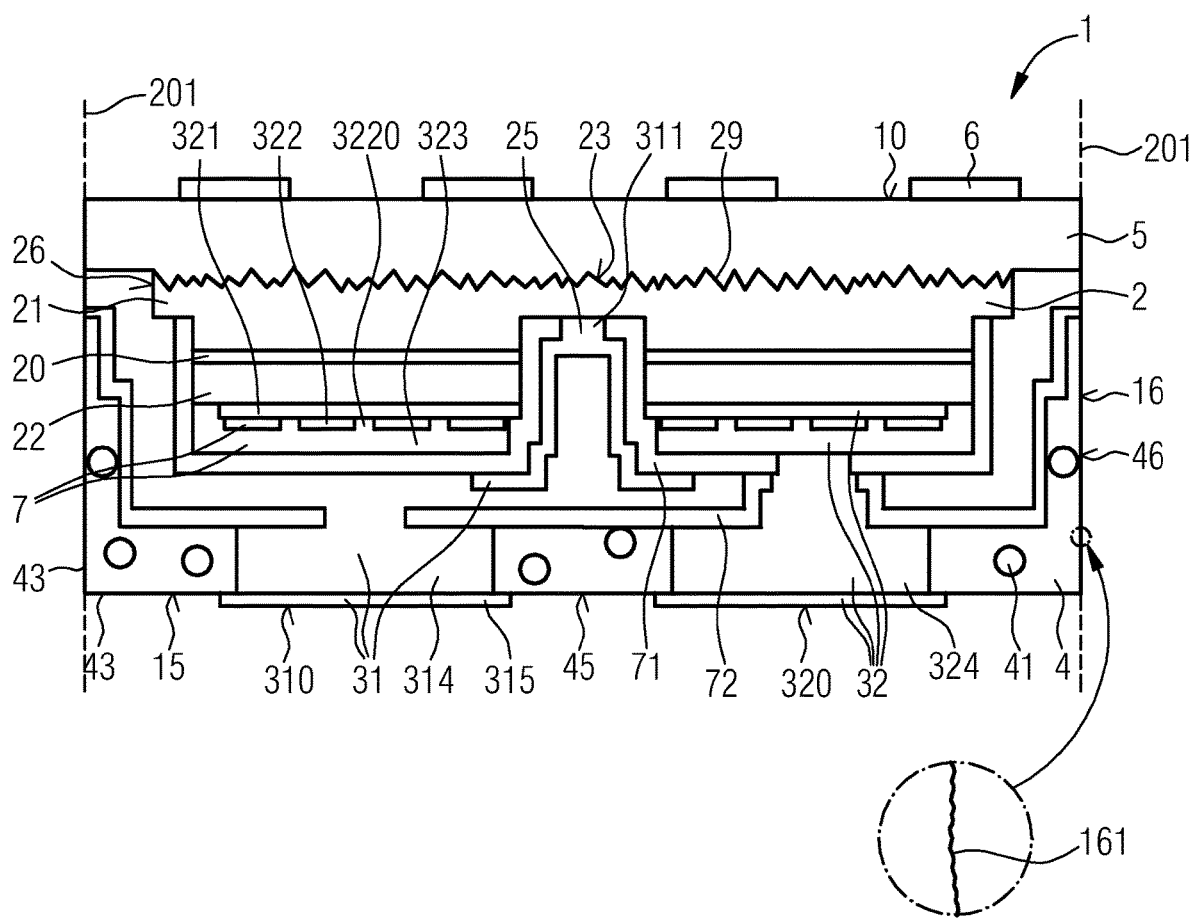

On the planarization layer 5, a polarizer layer 60 is applied, in particular deposited, for instance by vapor deposition or sputtering (FIG. 3C).

Finally, the semiconductor body assemblage 200 with the planarization layer 5 and the polarizer layer 60 is singulated into the plurality of semiconductor components. This is illustrated on the basis of singulating lines 201 in FIG. 3D.

During production of the semiconductor components 1, the latter thus already comprise a polarizer 6 at the radiation exit surface during singulation of the semiconductor body assemblage. In other words, the polarizer 6 is formed while still in the assemblage.

The singulating is effected, for example, by sawing, chemically, for instance by etching, or by a laser separating method.

For the rest, the completed semiconductor components 1 correspond to the example described with reference to FIGS. 1A and 1B. In particular, the planarization layer 5 can comprise one or more phosphors as described in association with FIG. 1A.

Our components, devices and methods are not restricted by the description on the basis of the examples. Rather, this disclosure encompasses any novel feature and also any combination of features that in particular includes any combination of features in the appended claims, even if the feature or combination itself is not explicitly specified in the patent claims or the examples.

The invention claimed is:

1. A semiconductor component comprising:
a radiation exit surface;
a semiconductor body having an active region that generates radiation; wherein
a molded body molded onto the semiconductor body;
contacts for external electrical contacting of the semiconductor component are accessible on an outer side of the molded body;
a deflection structure arranged between the active region and the radiation exit surface;
a planarization layer arranged on the deflection structure; and
a polarizer arranged on a side of the planarization layer facing away from the semiconductor body; wherein
the semiconductor body on a side facing away from the radiation exit surface comprises a mirror structure having at least one dielectric layer and a metallic connection layer, and the dielectric layer is arranged at locations between the semiconductor body and the metallic connection layer.

2. The semiconductor component as claimed in claim 1, wherein the planarization layer has a roughness of at most 50 nm on a side facing away from the semiconductor body and the polarizer directly adjoins the planarization layer.

3. The semiconductor component as claimed in claim 1, wherein a basic area of the semiconductor component in a plan view of the semiconductor component is larger than a basic area of the semiconductor body by at most 30%.

4. The semiconductor component as claimed in claim 1, wherein the planarization layer comprises a phosphor that at least partially converts the radiation generated in the active region into a secondary radiation.

5. The semiconductor component as claimed in claim 1, wherein the dielectric layer has a plurality of openings via which the metallic connection layer is electrically conductively connected to the semiconductor body.

6. The semiconductor component as claimed in claim 5, wherein a basic area of the mirror structure is at least 80% of a basic area of the semiconductor component.

7. The semiconductor component as claimed in claim 1, wherein the main body and the planarization layer have traces of a singulating method on a side surface delimiting the semiconductor component in a lateral direction.

8. The semiconductor component as claimed in claim 1, wherein the semiconductor component has a thickness of at most 100 µm.

9. A device comprising:
    the semiconductor component as claimed in claim 1 and an optical waveguide into which a radiation generated during operation is coupled.

10. The device as claimed in claim 9, wherein a side surface of the planarization layer is covered by an edge layer.

11. The device as claimed in claim 9, wherein the device is a display device or a light field display device.

12. The semiconductor component as claimed in claim 1 produced by a method comprising:
    a) providing a semiconductor body assemblage having a plurality of semiconductor bodies, wherein the semiconductor bodies, on a side facing away from the radiation exit surface, comprise a mirror structure having at least one dielectric layer and a metallic connection layer, wherein the dielectric layer is arranged at locations between the semiconductor body and the metallic connection layer;
    b) forming a planarization layer on the semiconductor body assemblage;
    c) forming a polarizer layer on the planarization layer; and
    d) singulating the semiconductor body assemblage with the planarization layer and the polarizer layer into the plurality of semiconductor components.

* * * * *